United States Patent [19]

Onodera et al.

[11] 4,315,215
[45] Feb. 9, 1982

[54] PLURAL FREQUENCY TYPE SUPERCONDUCTING QUANTUM INTERFERENCE FLUXMETER

[75] Inventors: Yutaka Onodera; Tsutomu Yamashita, both of Sendai, Japan

[73] Assignee: The President of Tokoku University, Japan

[21] Appl. No.: 5,775

[22] Filed: Jan. 23, 1979

[30] Foreign Application Priority Data

Jun. 25, 1978 [JP] Japan .................................. 53/76900

[51] Int. Cl.³ ............................................ G01R 33/02
[52] U.S. Cl. ................................................ 324/248
[58] Field of Search ........................ 324/248; 335/216; 365/160, 162; 307/308; 336/DIG. 1

[56] References Cited

U.S. PATENT DOCUMENTS 3,435,337 3/1969 Inouye et al. ...................... 324/248
3,758,854 9/1973 Zimmerman ........................ 324/248
4,004,217 1/1977 Giffard ................................ 324/248

OTHER PUBLICATIONS

Zimmerman, "Josephson Effect Devices and Low Frequency Field Sensing" Cryogenics, vol. 12, No. 1, pp. 19-31, Feb. 1972, IPC Science & Tech. Press Ltd.

*Primary Examiner*—Gerard R. Strecker
*Assistant Examiner*—Walter E. Snow
*Attorney, Agent, or Firm*—Robert E. Burns; Emmanuel J. Lobato; Bruce L. Adams

[57] ABSTRACT

A superconducting quantum interference fluxmeter, a super-high-sensitivity fluxmeter using a SQUID, suitable for use in precision electric instrumentation and superconducting electronics. The fluxmeter comprises a system to detect response output from the SQUID with high sensitivity by applying thereto such exciting AC as has a plurality of frequency components from an excitation AC source, and a system to detect with high sensitivity such alternating current as has higher or lower harmonic component of the exciting AC, which is generated by utilizing electromagnetic nonlinearity of the SQUID. Thus this invention markedly relieves difficulties in the manufacture and the use of the superconducting quantum interference devices, and enables selection of any desired operating temperature range, and compensation of quality changes with time.

6 Claims, 25 Drawing Figures

FIG. 1-I
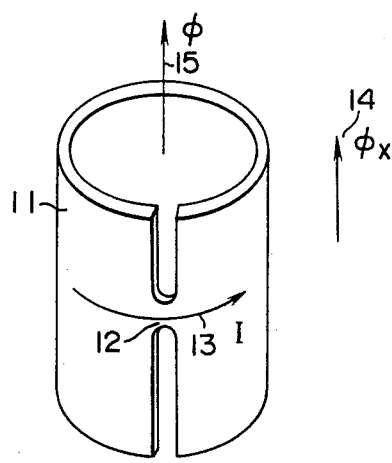
FIG. 1-II
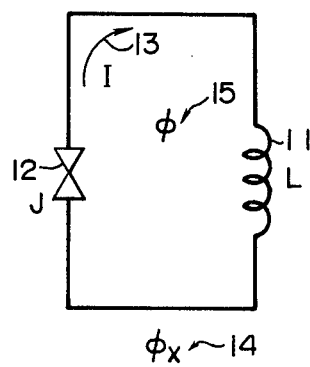

FIG. 2-I
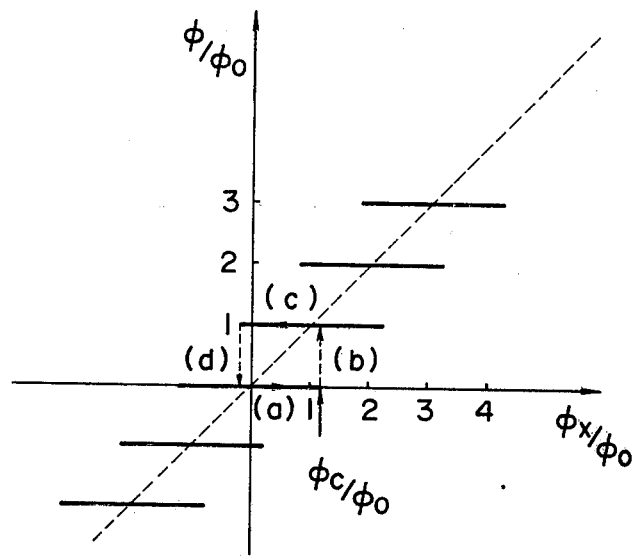
FIG. 2-II
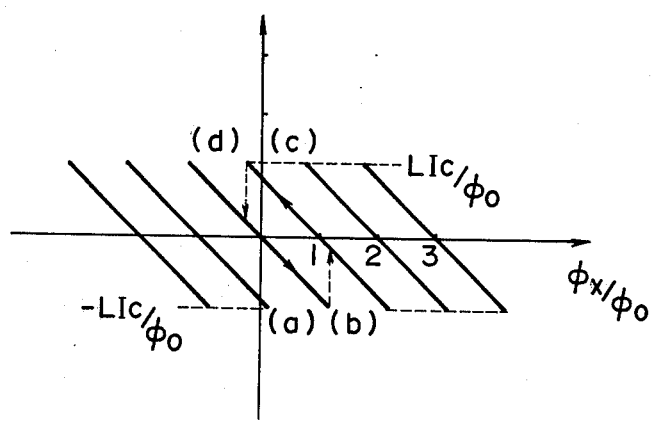

FIG. 4-I
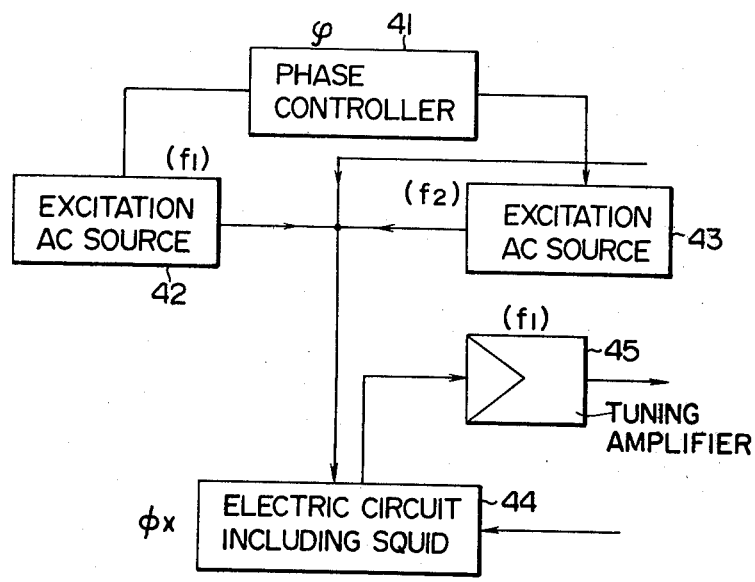
FIG. 4-II
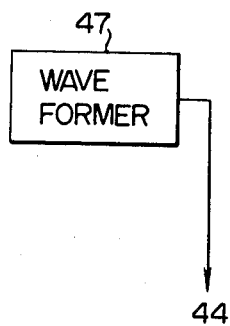
FIG. 4-III
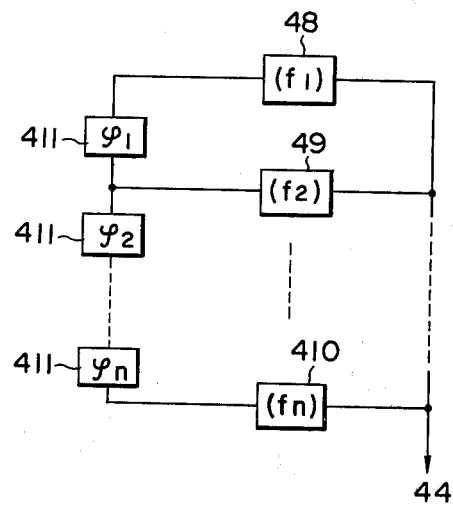

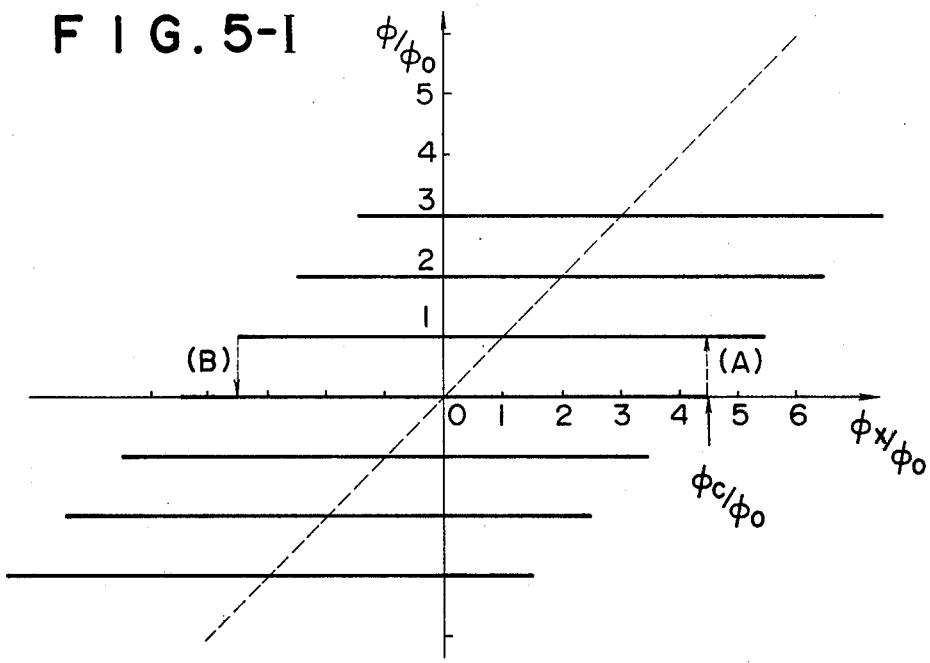
FIG.5-I
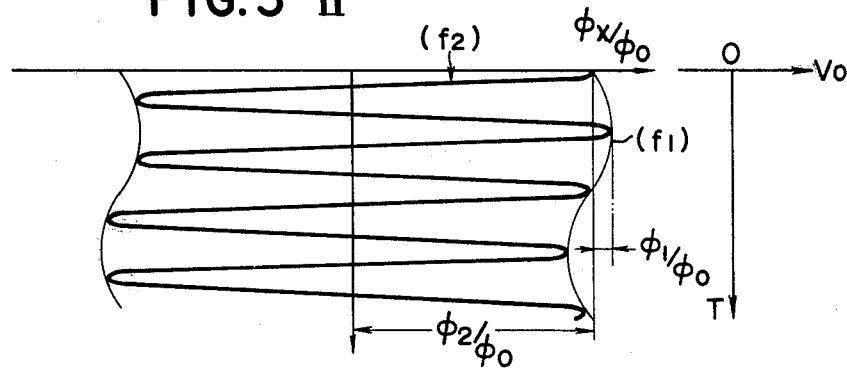
FIG.5-II
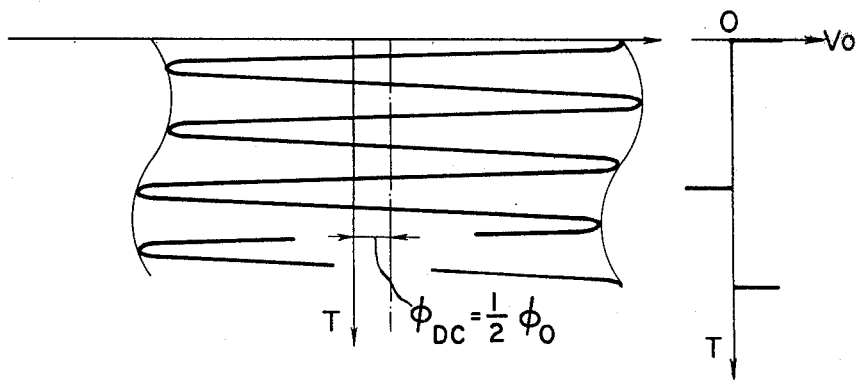
FIG.5-III

FIG. 6-I
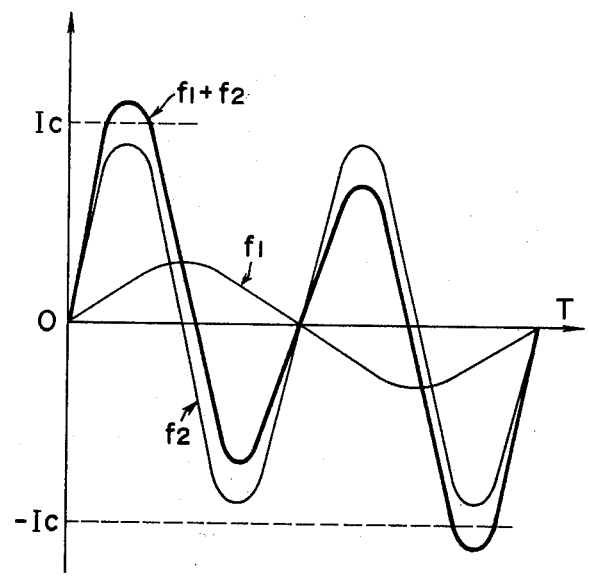
FIG. 6-II
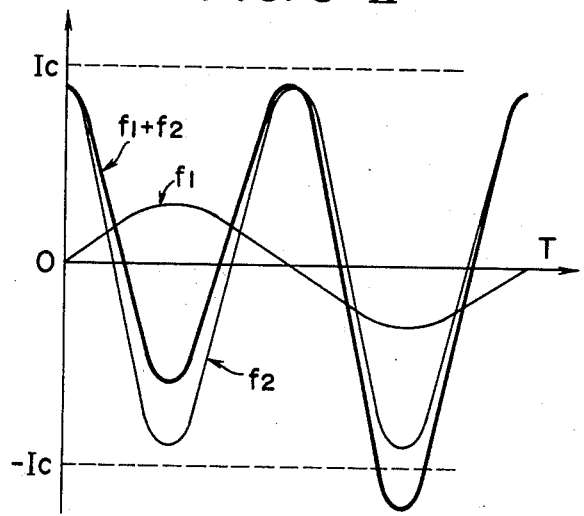

FIG. 8-I
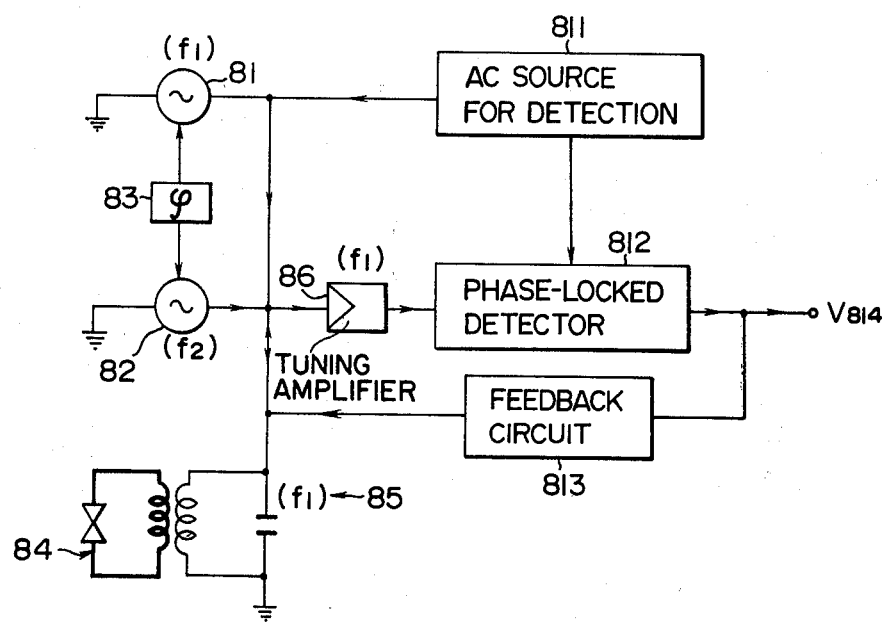

FIG. 9-I
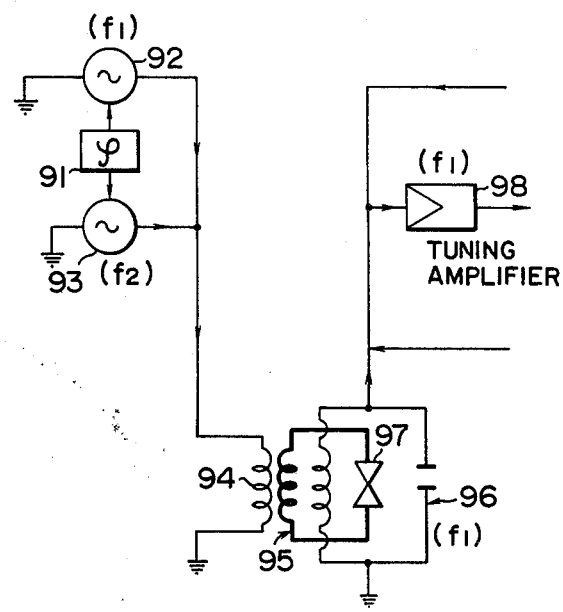
FIG. 9-II
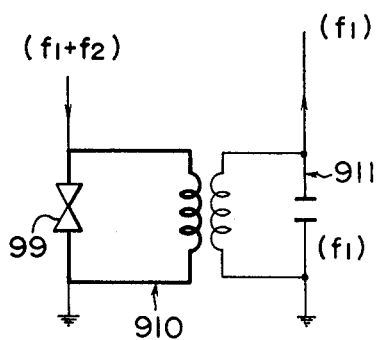

FIG.10-I
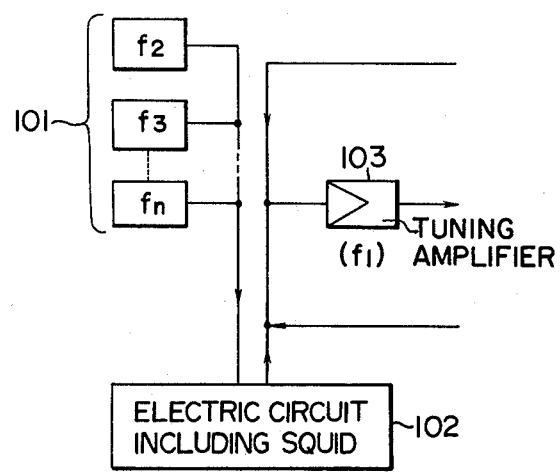
FIG.10-II
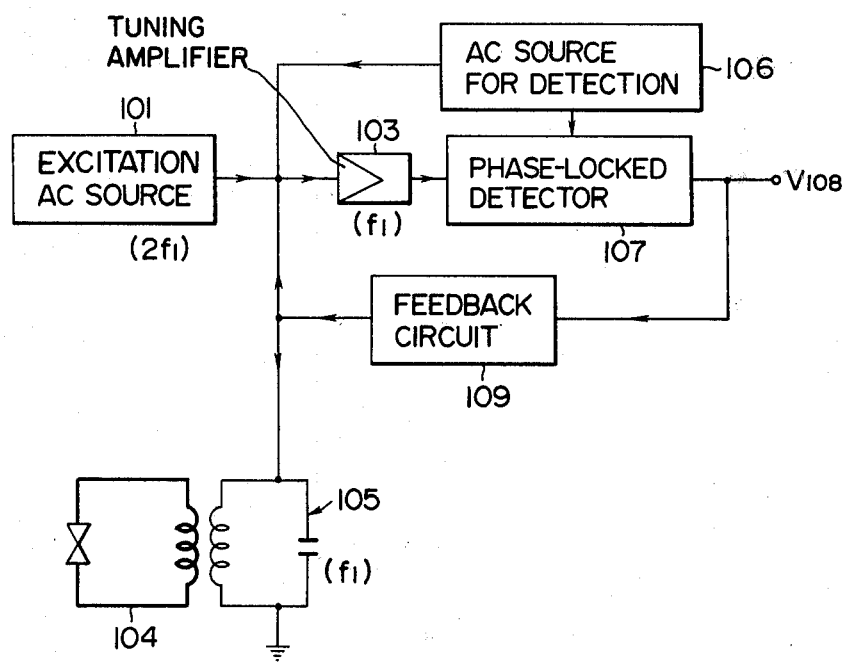

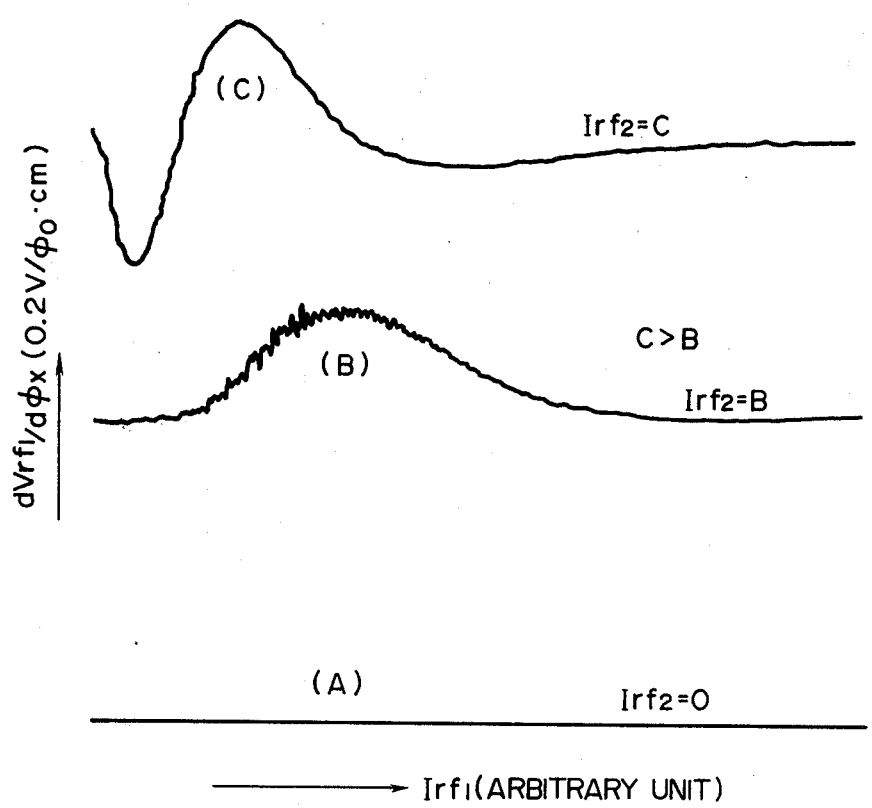

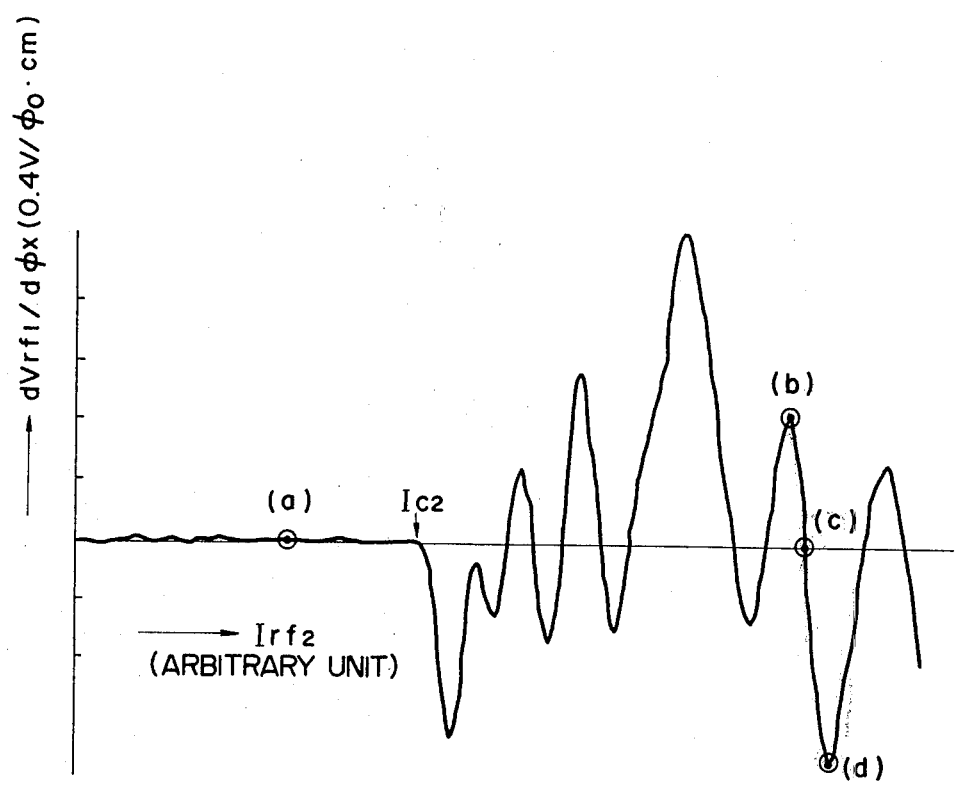
FIG. 12-I

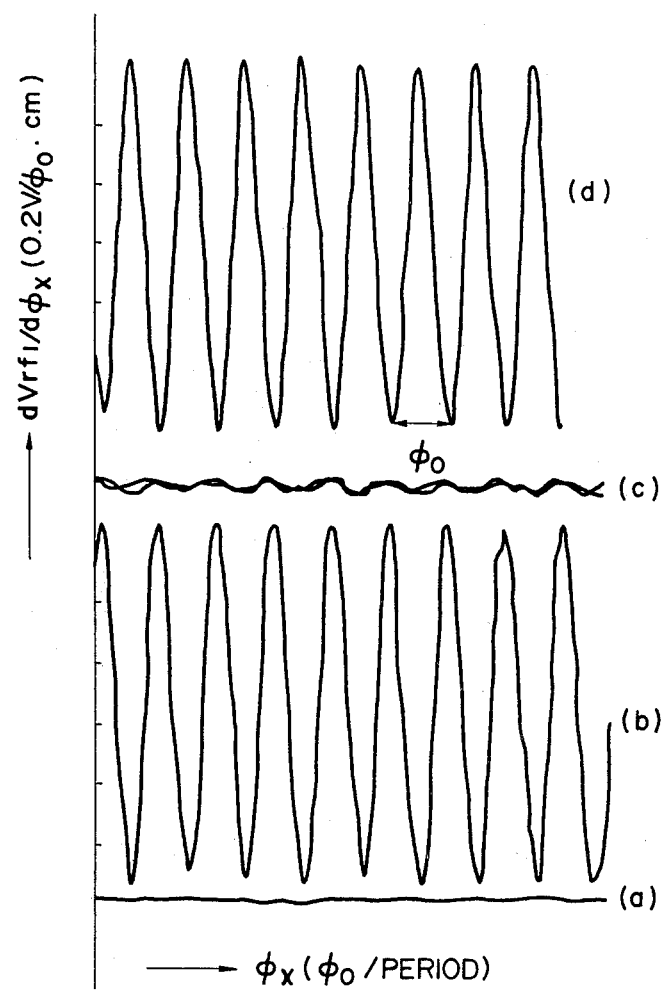
FIG.12-II

FIG. 14-I
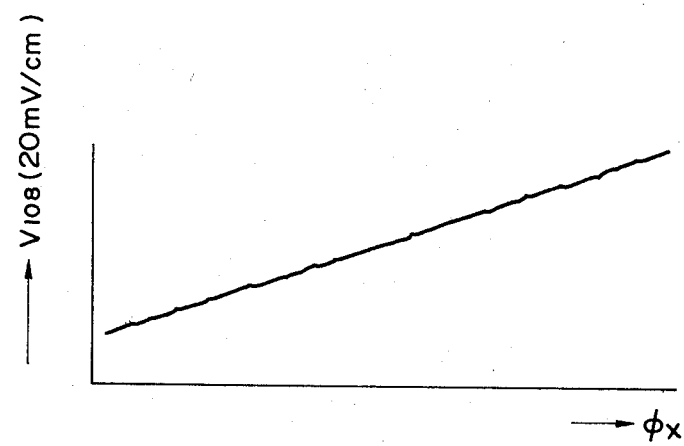
FIG. 14-II
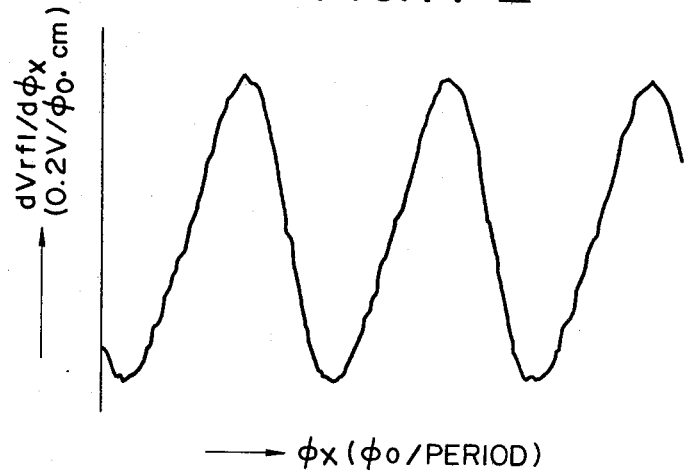

PLURAL FREQUENCY TYPE SUPERCONDUCTING QUANTUM INTERFERENCE FLUXMETER

FIELD OF INVENTION

This invention relates to a plural frequency type superconducting quantum interference fluxmeter used for precision electric instrumentation and superconducting electronics.

BACKGROUND OF THE INVENTION

The superconducting quantum interference fluxmeter is a superhigh-sensitivity fluxmeter using a superconducting quantum interference device, generally known as "SQUID" (abbreviated from superconducting quantum interference device). It utilizes the characteristic of the SQUID (a superconducting ring containing a weak superconducting part) to make cyclic responses to magnetic flux by increments of one flux quantum ($\phi_o = 2.07 \times 10^{-15}$ Weber).

As shown above, one flux quantum is a very small unit. But magnetic fluxes as weak as approximately 1/1000 flux quantum are measured by use of suitable measuring circuits. Magnetic flux can be related with electric current and voltage, using inductance and resistance. Therefore, the SQUID fluxmeter may be used as an ammeter and a voltmeter, too.

The SQUID is a device that captures and releases flux quantum into and out of a superconducting ring having a weak superconducting part, as controlled by application of electric current or magnetic field from outside. With this feature, it is becoming apparent that the SQUID may be utilized also as an electronic circuit device needed for large-capacity, subminiature and high-speed information processing machines used as ultra-low temperatures.

SUMMARY OF THE INVENTION

The present invention relates to a plurality frequency type superconducting quantum interference fluxmeter which is characterized by the fact that it provides means for detecting magnetic flux applied to a SQUID by means of applying exciting alternating current having plural frequency components to a SQUID through an electromagnetic coupling and amplifying alternating current having one frequency component of the output from the SQUID. The fluxmeter in accordance with the invention provides means detecting magnetic flux applied to a SQUID by means of applying exciting alternating current having plural frequency components to a SQUID through an electromagnetic coupling and amplifying alternating current having one frequency component of the higher or lower harmonics of the output from the SQUID.

The fluxmeter in accordance with the present invention offers many advantages such as relieving difficulties in the manufacture and use of the SQUID, selection of any desired operating temperature range and compensation of quality changes with time.

BRIEF DESCRIPTION OF DRAWINGS

The nature and advantages of the invention will appear more fully from the following description in conjunction with the accompanying drawings in which:

FIG. 1-I schematically illustrates a SQUID.

FIG. 1-II shows an electrical equivalent circuit.

FIGS. 2-I and 2-II graphically show the characteristics of the SQUID.

FIG. 4-I is an electric circuit diagram showing the principal part of a superconducting quantum interference fluxmeter embodying this invention.

FIGS. 4-II and 4-III show modifications of the circuit of FIG. 4-I.

FIGS. 5-I through 7 are graphs showing the characteristics of the circuitry.

FIGS. 8 through 10-II are electric circuit diagrams showing other embodiments of this invention.

FIGS. 11 through 14-II are graphs showing the operating conditions of the fluxmeters according to this invention.

DESCRIPTION OF PREFERRED EMBODIMENTS

Figure 3:
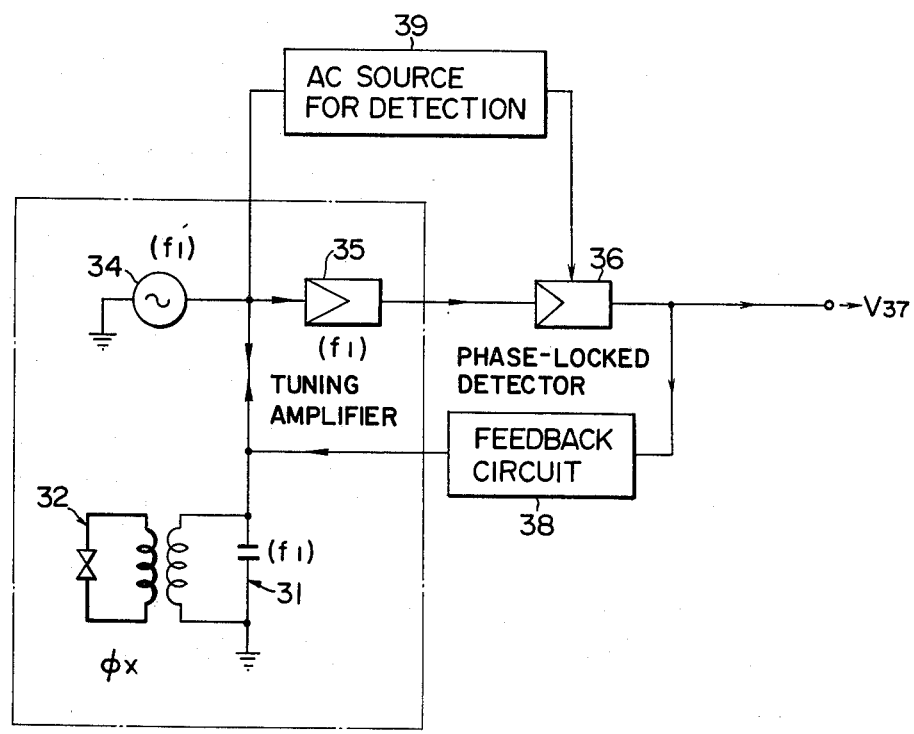
FIG. 3 is an electric circuit diagram of a conventional superconducting quantum interference fluxmeter.

The simplest SQUID comprises a superconducting cylinder 11 with a narrowed portion that constitutes a weak superconducting part 12 (called a weak coupling element), as shown in FIG. 1-I. A superconducting critical current Ic flows through the weak coupling element 12, whose superconductivity reduces to normal conductivity when a current exceeding Ic flows therethrough. Application of an external magnetic flux $\phi_x$ 14 parallel to the axis of the SQUID cylinder develops an induced current I flowing around the cylinder, as indicated by reference numeral 13, and an internal magnetic flux $\phi$ inside the cylinder as indicated by reference numeral 15.

FIG. 1-II shows an electrical equivalent circuit of the SQUID. This is a closed circuit formed by the inductance L and weak coupling element 12, indicated by reference numerals 11 and 12, respectively. FIGS. 2-I and 2-II respectively show changes in the internal magnetic flux $\phi$ and the induced current I that occur on applying a magnetic flux $\phi_x$ from outside to the SQUID. When the magnetic flux $\phi_x$ is applied from outside, a diamagnetic current I first flows through the cylinder because the weak coupling element 12 is in a superconducting state (as indicated by (a) in FIG. 2-II), keeping the magnetic flux $\phi$ in the cylinder at zero (as indicated by (a) in FIG. 2-I). When the external magnetic flux $\phi_x$ increases to $\phi_c = LIc$, conductivity of the weak coupling element temporarily becomes normal, whereupon the internal magnetic flux $\phi$ changes to $\phi_o$, as indicated by (b) in FIGS. 2-I and 2-II.

When the magnetic flux $\phi_x$ is reduced, I returns to Ic and $\phi$ becomes zero, and the SQUID consumes power during this change, as indicated by (c) and (d) in FIGS. 2-I and 2-II.

FIG. 3 exemplifies a typical electrical circuit of the conventional superconducting quantum interference fluxmeter. An AC source 34 supplies an AC current with a frequency $f_1$ to a SQUID 32 through a resonance circuit 31 having a frequency $f_1$. On gradually increasing the AC current, voltage of the resonance circuit first increases correspondingly. But when current induced in the SQUID 32 reaches Ic, the SQUID 32 starts to consume power, whereupon the voltage V of the resonance circuit 31 no longer increases with increasing AC current applied.

On further increasing the AC current with the frequency $f_1$ applied from the AC source 34, the voltage V starts to increase again. The critical voltage Vc at which the increase in the voltage V stops changes with the DC magnetic flux $\phi_x$ on a cycle of $\phi_o$, as shown in FIG. 2.

A tuning amplifier 35 with a frequency $f_1$ and a phase-locked detector 36 amplify and detect changes in the critical voltage Vc with the DC magnetic flux $\phi_x$. By then reversely feeding back part of a DC output voltage $V_{37}$ through a feedback circuit 38, the SQUID is always kept in the $\phi=0$ state and the DC voltage $V_{37}$ becomes proportional to the magnetic flux $\phi_x$. An AC source for detection 39 applies to the SQUID 32 a weak AC signal whose frequency is fairly lower than the frequency $f_1$, and the phase-locked detector 36 synchronously detects the response of the SQUID modulated by said signal. Hereinafter, alternating current from the AC source for synchronous detection 39 is called the detecting AC, and alternating current with the frequency $f_1$ from the high-frequency AC source 34, applied to the SQUID to generate high-frequency response, is called the exciting AC.

Generally, alternating current from the AC source for detection has a frequency not higher than 1 MHz, and that from the AC source for excitation 34 not lower than 1 MHz. In such conventional electric circuit, the AC amplifier 35 directly amplifies AC input whose frequency is $f_1$, too. When the critical voltage Vc is smaller than this AC input, therefore, the AC amplifier 35 becomes saturated and Vc fails to be detected.

Because the AC amplifier 35 usually is provided with high gain, only a very low input voltage does not saturate it. For this reason, the SQUID 32 has been required to satisfy the relationship $LIc \sim \phi_o$ to make the circuit operative. If inductance L is enhanced to increase flux sensitivity, the critical current Ic becomes very small. Accordingly, the conventional circuit requires a weak coupling element with fairly small Ic (on the order of $\mu A$). It has therefore been essential to manufacture with high reproducibility such elements as satisfy the requirement $LIc \sim \phi_o$ and change little with time.

Conventionally, it has been very difficult to control the manufacture of elements having very small critical current Ic. So their production has depended much on technical skill of manufacturers. In addition, the conventional system has an important shortcoming. Even if elements with suitable Ic are manufactured, Ic increases as temperature drops as in general superconducting matters. Therefore, a SQUID fluxmeter using such element as is effective at high temperatures sometimes becomes inoperative at low temperatures where $LIc >> \phi_o$. Because of this shortcoming, the SQUID has to be maintained at a constant temperature. When measurement extends over a wide temperature range, a complex cryostat is needed to keep the SQUID at a constant temperature.

This invention intends to solve the above-mentioned problems by replacing the conventional single-frequency exciting AC application system that detects response output from the SQUID by applying alternating current having a given frequency $f_1$ from the exciting AC source, as shown in FIG. 3, with the following: (1) A system to detect response output from the SQUID with high sensitivity by applying thereto such exciting AC as has a plurality of frequency components from an excitation AC source; and (2) A system to detect with high sensitivity such alternating current as has higher or lower harmonic component of the exciting AC, which is generated by utilizing electromagnetic nonlinearity of the SQUID.

The object of this invention is to provide a superconducting quantum interference fluxmeter that is perfectly free from the difficulty in the manufacture of the SQUID and operable at any desired temperature, by adjusting and controlling the amplitude and frequency of the alternating current applied to the SQUID and the phase difference between the plurality of exciting alternating currents in the multi-frequency exciting AC applying system, and utilizing the characteristic of the electromagnetic nonlinearity of the SQUID that the response output AC thereof is convertible to an alternating current having a frequency equal to the higher or lower harmonic component of the frequency of the input AC.

The superconducting quantum interference fluxmeter according to this invention is characterized by having means for applying exciting current having plural frequency components to a superconducting quantum interference device through electromagnetic coupling, an amplifier to amplify alternating current having one or more frequency components outputted from said superconducting quantum interference device, and means for detecting magnetic flux applied to said superconducting quantum interference device by receiving the alternating current amplified by said amplifier.

The superconducting quantum interference fluxmeter according to this invention is also characterized by having means for applying electric alternating current to a superconducting quantum interference device through electromagnetic coupling, an amplifier to amplify alternating current having one or more frequency components outputted from said superconducting quantum interference device, and means for detecting magnetic flux applied to said superconducting quantum interference device by receiving the alternating current amplified by said amplifier.

Now the superconducting quantum interference fluxmeter according to this invention will be described by reference to the accompanying drawings. This invention relates to the framed portion of the circuit in FIG. 3, containing the AC source for excitation 34, tuning amplifier 35, SQUID 32, and resonance circuit 31. Being similar to FIG. 3, the unframed portion will be omitted from the following description.

FIG. 4-I shows the structure of a multi-frequency AC applying superconducting quantum interference fluxmeter according to this invention. This shows the simplest case in which exciting alternating current having two frequencies $f_1$ and $f_2$ are applied from excitation AC sources 42 and 43 to an electric circuit 44 containing the resonance circuit and SQUID.

The excitation AC sources 42 and 43 generate two alternating currents having frequency components $f_1$ and $f_2$ whose phase relation are fixed by a phase controller 41. An alternating current prepared by combining said two currents is applied as an exciting alternating current to the electric circuit 44 containing the SQUID.

Output from the SQUID in the electric circuit 44 is amplified by a tuning amplifier 45 having a frequency $f_1$. In FIG. 4-II, a suitable alternating current having plural frequency components, prepared not by the excitation AC sources 42 and 43 and phase controller 41 in FIG. 4-I but by a wave former 47, is applied to the electric current 44 containing the SQUID, through electromagnetic coupling.

In FIG. 4-III, instead of the excitation AC sources 42 and 43 and phase controller 41 in FIG. 4-I, a plurality of AC sources 48, 49, . . . , 410 prepare plural alternating currents having plural frequency components whose phase relations are fixed by a phase controller 411. These alternating currents are applied as exciting AC to the electric circuit 44 containing the SQUID through electromagnetic coupling.

In FIGS. 4-I, -II and -III, the exciting alternating current is applied to the electric circuit 44 containing the SQUID either directly or through electromagnetic coupling comprising resistance, inductance, capacitance, or mutual inductance. The response output alternating current from the electric circuit 44 is amplified by the tuning amplifier 45 having a frequency $f_1$. The tuning frequency of this tuning amplifier 45 may be either of $f_2$, $f_3$ and $f_n$. The unframed portion of the electric circuit in FIG. 3 detects the amplified output from this tuning amplifier 45, thereby also detecting external magnetic flux applied on the SQUID. Referring now to FIG. 5, basic operation of the SQUID, applied with the exciting alternating current having frequencies $f_1$ and $f_2$, will be described.

Like FIG. 2-I, FIG. 5-I shows the relationship between the magnetic flux $\phi x$ applied to the SQUID and the internal magnetic flux $\phi$ of the SQUID, wherein $LIc/\phi o = n = 4.5$. In the embodiment of this invention, generally, n may be greater than or equal to 1 ($n \gtrsim 1$). FIG. 5-II shows application to such SQUID of a magnetic flux having a waveform obtained by combining two alternating currents with frequencies $f_1$ and $f_2$. In this case, $f_2 > f_1$, and one is an integral multiple or an integral fraction of the other. The alternating current in this figure has a form of sine wave, but its wave form may also be triangular, square, rectangular tooth-shaped, and so on, containing high-frequency components $f_1$ and $f_2$. The frequencies $f_1$ and $f_2$ need not have similar wave forms, too.

As shown in FIG. 5-II, the exciting alternating current having the frequencies $f_1$ and $f_2$ is applied to the closed circuit of the SQUID. If the resulting magnetic fluxes $\phi_1$ and $\phi_2$ are such that $\phi_1 + \phi_2 < \phi_c$, the internal magnetic flux of the SQUID is always zero ($\phi = 0$), and the electric circuit 44 containing the SQUID develops no response output voltage Vo indicating the transfer of magnetic flux into and out of the SQUID. If then a DC magnetic flux $\phi_{DC}$ of a suitable magnitude is applied from outside as shown in FIG. 5-III (wherein the DC magnetic flux from outside is ½ of $\phi_o$), the relationship $\phi_{DC} + \phi_1 + \phi_2 > \phi_c$ is obtained in a positive ½ cycle of the envelope of the magnetic field combining the alternating currents with the frequencies $f_1$ and $f_2$, and the internal magnetic flux of the SQUID $\phi$ changes from zero to $\phi_o$, as indicated by the arrow (A) in FIG. 5-I. In the next negative ½ cycle thereof, the internal magnetic flux $\phi$ transits from $\phi_o$ to zero, as indicated by the arrow (B) in FIG. 5-I. With every transit, the SQUID consumes energy applied by the alternating current having the frequencies $f_1$ and $f_2$, and develops a positive-negative pulsating voltage, having a fundamental frequency $f_1$, at intervals of T, as shown in FIG. 5-III.

Therefore, existence of the DC magnetic flux applied from outside to the SQUID is detected by amplifying and detecting only such signal whose frequency is $f_1$ with the tuning amplifier 45 in FIG. 4, out of the pulsating voltage having the fundamental frequency $f_1$. Because of the periodical response characteristic of the SQUID to the applied magnetic flux, increasing the DC magnetic flux until $\phi_{DC}$ becomes equal to $\phi_o$ ($\phi_{DC} = \phi_o$) produces a condition similar to one with $\phi_{DC} = 0$, whereupon the SQUID discontinues to develop the pulsating voltage again. Accordingly, the output voltage $V_o$ from the SQUID-containing electric circuit 44 periodically changes with the external magnetic flux at intervals of $\phi_o$.

As shown in FIG. 5-I, the magnetic flux $\phi_2$ resulting from the exciting alternating current with a frequency $f_2$ is set a little lower than 4.5 $\phi_o$. Then, as apparent from FIG. 5-III, the SQUID-containing electric circuit 44 shown in FIG. 4-I, develops an output voltage $V_o$, having a fundamental frequency $f_1$, on application of a DC magnetic flux, by only combining a very small magnetic flux $\phi_1$ produced by an exciting alternating current with a frequency $f_1$ with an exciting magnetic flux with a frequency $f_2$.

In this case, amplitude of the alternating current, having the frequency $f_1$, applied from the excitation AC source 42 is small. By using this applied alternating current having the frequency $f_1$, therefore, the tuning amplifier 45 can sensitively, and without becoming saturated, amplify the alternating current with the frequency $f_1$, which is outputted from the SQUID-containing electric circuit 44 in response to the magnetic flux applied to the SQUID.

Even if $LIc \gg \phi_o$, the circuit of this invention designed on the above-described operating principle can operate the SQUID, developing the magnetic flux $\phi_2$ by applying the current $I_2$, which is induced in the superconducting cylinder by the alternating current having the frequency $f_2$, close to the critical current Ic in the weak coupling element and the magnetic flux $\phi_1$, which is to be combined with the very small magnetic flux $\phi_1$, by applying the alternating current $I_1$ having the frequency $f_1$. Not tuned to the tuning amplifier 45 on the output side, the large AC signal due to the alternating current $I_2$ having the frequency $f_2$, which is applied close to the critical current Ic, is scarcely detected at the output end of said tuning amplifier 45. The tuning amplifier 45 amplifies and detects only such output signals that are generated in response to the fundamental frequency of the small current $I_1$.

Unlike the conventional system, accordingly, the system according to this invention need not satisfy the requirement that $LIc \sim \phi_o$. The value of LIc of the SQUID is unlimited.

This fact shows that the system of this invention has unprecedented excellent features, including marked elimination of the difficulty in the manufacture of the SQUID. Furthermore, it permits selecting the operating temperature at will, so far as the SQUID material remains superconductive, by selecting such alternating current as has the frequency $f_2$ whose amplitude and phase are suitable with respect to the alternating current having the frequency $f_1$. In addition, it can compensate for a timewise change in Ic by adjusting the amplitude of the alternating current with the frequency $f_2$.

When the electric circuit 44 in FIG. 4-I contains a resonance circuit, it may be tuned to either or both of the frequencies $f_1$ and $f_2$. When the excitation AC sources 48, 49, . . . , 410 in FIG. 4-III are used, the resonance circuit in the electric circuit 44 may be tuned to any one or more of the frequencies $f_1$, $f_2$, . . . , $f_n$.

Next, the phase difference $\phi$ between the alternating currents having the frequencies $f_1$ and $f_2$, which are combined in the system of this invention, will be described.

FIG. 6 shows how the waveform of the composite current, made by combining the alternating currents having the frequencies $f_1$ and $f_2$ ($f_2 = 2f_1$) and indicated by a heavy solid line, changes with the phase difference $\phi$ therebetween. This figure plots current induced in the SQUID along the y-axis and time T along the x-axis. Let's assume that the maximum current made by combining the currents induced by the exciting alternating currents having the frequencies $f_1$ and $f_2$ is larger than the critical current Ic of the SQUID. When the phase difference $\phi$ is zero ($\phi=0$) as shown in FIG. 6-I, the current induced by said alternating currents exceeds Ic. Then the SQUID admits and discharges magnetic flux to function as a magnetic flux detecting element. If the phase difference between the two alternating currents is as shown in FIG. 6-II ($\phi=\pi/2$), though their amplitudes are the same as in FIG. 6-I, only the negative side of the composite current, corresponding to half the cycle of $f_1$, may exceed Ic. Then the SQUID does not operate as a magnetic flux detecting element.

This phenomenon occurs not only when combining two alternating currents having the frequencies $f_1$ and $f_2$, but when combining more alternating currents with different frequencies as shown in FIG. 4-III. High-sensitivity magnetic flux detection is attained by controlling the phase difference between these alternating currents with different frequencies together with the amplitudes of the exciting alternating currents.

Figure 7:
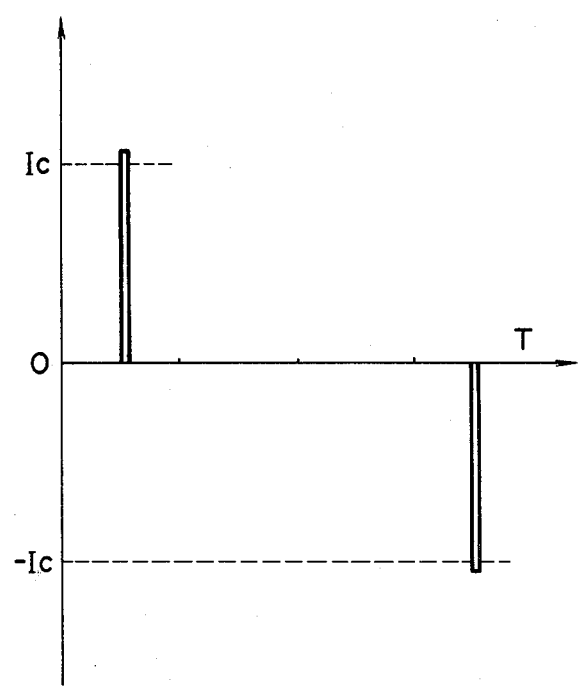

The wave former 47 in FIG. 4-II produces such exciting alternating current containing multiple frequency components with fixed phase difference therebetween. Accordingly, the fluxmeter according to this invention detects magnetic flux with the greatest sensitivity when the phase difference between the exciting alternating currents having a plurality of frequencies is suitably fixed. Where simpler means is preferred, however, this fluxmeter can operate without the phase difference control, though the fluctuating phase difference may produce noise and the detecting sensitivity may drop as compared with the fluxmeter operating with the fixed phase difference. The wave former 47 in FIG. 4-II can make alternating currents of any desired wave form, including a composite wave shown in FIG. 6. The same operation as in FIG. 6-I can be achieved by using an exciting alternating current with a pulse wave whose amplitude exceeds Ic as shown in FIG. 7. This is identical with the use of an exciting alternating current having a fundamental frequency $f_1$ and a plurality of higher harmonics whose frequencies are integral multiples thereof, which may be prepared by plural excitation AC sources 48, 49, ..., 410 shown in FIG. 4-III. The tuning amplifier 45 in FIG. 4-I may be such that one component of higher or lower harmonics of the exciting alternating current prepared in FIGS. 4-II and 4-III are selectively tuned and amplified.

FIG. 8 shows an embodiment wherein an AC source for excitation 81 having a frequency $f_1$ and another AC source for excitation 82 having a frequency $f_2$ synchronized therewith are added to the conventional circuit shown in FIG. 3. This figure shows that a resonance circuit 85 and a tuning amplifier 86 both operate at the frequency $f_1$. In FIG. 8, the AC sources for excitation 81 and 82 produce AC signals having the frequencies $f_1$ and $f_2$ whose phase relationship is suitably fixed by a phase controller 83. These signals are applied through the resonance circuit 85 to the SQUID 84. An output alternating current is drawn from the resonance circuit 85, amplified by the tuning amplifier 86 having the frequency $f_1$, and detected by a phase-locked detector 812. Part of DC output voltage $V_{814}$ is negatively fed back through a feedback circuit 813. The phase-locked detector 812 applies a detecting AC signal from a detecting AC source 811 to the SQUID 84 and synchronously detects a response from the SQUID 84 modulated by said signal. Because of the additional exciting alternating current having the frequency $f_2$, the SQUID performs the same function as illustrated in FIG. 5 even if $LIc \gg \phi_o$. That is, it dispenses with the conventional requirement $LI \sim \phi_o$.

The next embodiment is a concrete example of the principle illustrated in FIG. 4-I, in which the response output from the SQUID is separated from the applied alternating current. Electromagnetically independent wirings are provided to the SQUID to separately supply the exciting alternating current thereto and draw the output current therefrom.

FIG. 9 is a connection diagram wherein exciting alternating currents, having frequencies $f_1$ and $f_2$, inputted to the SQUID 95 are separated from the response output therefrom. FIG. 9-I shows an embodiment wherein the exciting alternating current and a SQUID 95 are electrically connected through a mutual inductance 94. A capacitance to form a resonance circuit may be added to this circuit. FIG. 9-II shows a directly connected embodiment, but this connection may be made by way of a resistance, inductance, capacitance or resonance circuit, as well. Exciting AC sources 92 and 93 develop alternating currents having frequencies $f_1$ and $f_2$ whose phase relationship is fixed by a phase controller 91. An exciting signal, the amplitude of which equals to the sum of the amplitudes of said alternating currents, is applied to the SQUID 95 containing a weak coupling element 97 through the mutual inductance 94 in FIG. 9-I, and direct to the SQUID 910 containing a weak coupling element 99 in FIG. 9-II. The response output from the SQUID 95 or 910 is drawn through a resonance circuit 96 or 911 having a resonance frequency $f_1$, amplified in a tuning amplifier 98 tuned to the frequency $f_1$, and delivered to the electric circuit illustrated in FIG. 3. The closed circuit of the SQUID 95 and 910 may be regarded as equivalent to a shorted inductance circuit except when the weak coupling elements 97 and 99 admit and emit magnetic flux quantum. Therefore, not only the exciting alternating current having the frequency $f_2$ but also one having the frequency $f_1$ scarcely appear in the resonance circuit 96 or 911. Consequently, unlike the case of FIG. 3, the tuning amplifier 98 tuned to the frequency $f_1$ is scarcely saturated with the inputted exciting alternating current. It is also permissible to apply only the alternating current having the frequency $f_1$, with the alternating current having the frequency $f_2$ applied to the SQUID 95 or 910 through the resonance circuit 96 or 911 as in the case of FIG. 8. The direct connection circuit of FIG. 9-II permits using a higher frequency as $f_2$ than in the embodiment of FIG. 9-I. The embodiments of FIGS. 8 and 9 employ two exciting alternating currents having the frequencies $f_1$ and $f_2$. But it is also possible to apply to the SQUID more exciting alternating currents containing a greater number of frequency components, by use of such AC sources for excitation as shown in FIGS. 4-I and 4-II. Then, the resonance circuit 85 in FIG. 8, the resonance circuit 96 in FIG. 9-I, and the resonance circuit 911 in FIG. 9-II may be so designed as to respond to such alternating current as has one suitable frequency component of higher or lower harmonics of the exciting alternating currents applied.

Next, utilization of the electromagnetic nonlinearity of the SQUID according to this invention will be described in detail. As explained by reference to FIG. 5-III, the SQUID develops pulse voltage attendant on the capture and discharge of magnetic flux quantum when the current passing thereacross exceeds Ic. This pulse voltage contains higher and lower harmonics of the alternating current applied. Therefore, the magnetic flux applied can be detected efficiently by utilizing this nonlinearity. More specifically, this detection is achieved by applying a suitable alternating current to operate the SQUID and amplifying an alternating current, having one of the frequency components contained in the higher or lower harmonics of the alternating current applied, outputted therefrom.

FIG. 10-I shows the structure of a SQUID fluxmeter of this invention utilizing the electromagnetic nonlinearity of the SQUID. Excitation AC sources 101 produce alternating current having one or more frequencies $f_2, f_3, \ldots, f_n$, and the sum of these AC amplitudes is applied to an electric circuit 102 containing a SQUID through a suitable electromagnetic coupling. Out of the AC output, a frequency $f_1$, which is one component of the higher or lower harmonics of the frequencies $f_2, f_3 \ldots f_n$ of the AC input, is drawn through a suitable electromagnetic coupling. By amplifying the frequency $f_1$ with a tuning amplifier 102 tuned at $f_1$, the magnetic flux applied to the SQUID 102 is detected. Beyond the detecting circuit, this system also employs the same component parts as in FIG. 3. When the frequencies $f_2, f_3 \ldots f_n$ of the AC input are different from the frequency $f_1$ of the AC ouput, the AC input does not saturate the tuning amplifier 103. Therefore, and owing to the characteristic of the SQUID, any value not smaller than 1 may be selected as $LIc/\phi_o$.

FIG. 10-II shows an embodiment wherein an alternating current having a single frequency is used for excitation, with the frequency of the excitation AC source 101 being double the frequency $f_1$ of the tuning amplifier 103. This alternating current is applied to a SQUID 104 through a resonance circuit 105 having a frequency $f_1$. Only such a signal whose frequency is $f_1$ is selected out of the output therefrom, delivered through the resonance circuit 105 to the tuning amplifier 103 for amplification, and detected by a phase-locked detector 107. Part of the DC output voltage $V_{108}$ is negatively fed back through a feedback circit 109 to the SQUID 104.

The phase-locked detector 107 synchronously detects the response from the SQUID 104 that has been modulated by a detecting alternating current applied from an AC source for detection 106 to the SQUID 104. Because the exciting AC input does not contain the frequency $f_1$, the input AC voltage does not saturate the tuning amplifier 103. Therefore, $LIc/\phi_o$ of the SQUID may assume any value not smaller than 1. The AC frequency from the excitation AC source 101 may be an integral multiple or an integral fraction of the frequency $f_1$, or a composite frequency thereof. This exciting alternating current need not contain the frequency $f_1$.

In the embodiment of FIG. 10-I, the exciting AC input is developed by a plurality of excitation AC sources 101. But suitable waveforms, as shown in FIGS. 6 and 7, may be formed by use of the wave former 47 described by reference to FIG. 4-II. The exciting AC input can be efficiently applied to the SQUID through an electromagnetic coupling described by reference to FIGS. 8 and 9. FIGS. 11 and 12 show examples of the operating results of the fluxmeter of this invention, applied with two frequencies. That is, frequencies of 20 MHz and 40 MHz are applied as $f_1$ and $f_2$, respectively, to the circuit shown in FIG. 8, with the feedback circuit 813 being kept inoperative. In FIG. 11, an exciting alternating current $Irf_1$ having a frequency $f_1$ is increased, while an exciting alternating current $Irf_2$ having a frequency $f_2$ is kept constant. A differential quotient $dVrf_1/d\phi_x$ is obtained by differentiating a response output voltage $Vrf_1$, having a frequency $f_1$, with respect to an external magnetic flux $\phi_x$. This $dVrf_1/d\phi_x$ represents the magnetic flux senstivity of the SQUID fluxmeter, which is, in this case, the output voltage $V_{814}$ from the phase-locked detector 812. As shown in FIG. 11-(A), the SQUID fluxmeter does not detect the output voltage if the exciting alternating current $Irf_2$, having the frequency $f_2$, is reduced to zero. In FIGS. 11-(B) and (C), the output voltage is detected because $Irf_2$ is higher than a given value.

In FIG. 12-I, the magnetic flux sensitivity $dVrf_1/d\phi_x$ is established by increasing the exciting alternating current $Irf_2$ while keeping constant the exciting alternating current $Irf_1$.

In FIG. 12-II, the magnetic flux sensitivity $dVrf_1/d\phi_x$ against the external magnetic flux $\phi_x$ is established by fixing the relationship between the exciting alternating currents $Irf_1$ and $Irf_2$ as $Irf_1 << Irf_2$. When, for example, $Irf_1$ is fixed at points (a), (b), (c) and (d) in FIG. 12-I, such responses as (a), (b), (c) and (d) in FIG. 12-II are obtained. The magnetic flux $\phi x$ at (b) and (c) in FIG. 12-II cycles at intervals of one magnetic flux quantum $\phi_o$. When $Irf_1$ is fixed, the SQUID does not respond until $Irf_2$ exceeds a given critical value $Ic_2$. With a further increase in $Irf_2$, the magnetic flux sensitivity changes priodically as in the conventional fluxmeters. Though it is an element whose $LIc >> \phi_o$ does not operate in the conventional SQUID fluxmeters, these test results have disclosed that such element can operate if it is applied with exciting alternating current having plural frequencies according to this invention.

Figure 13:
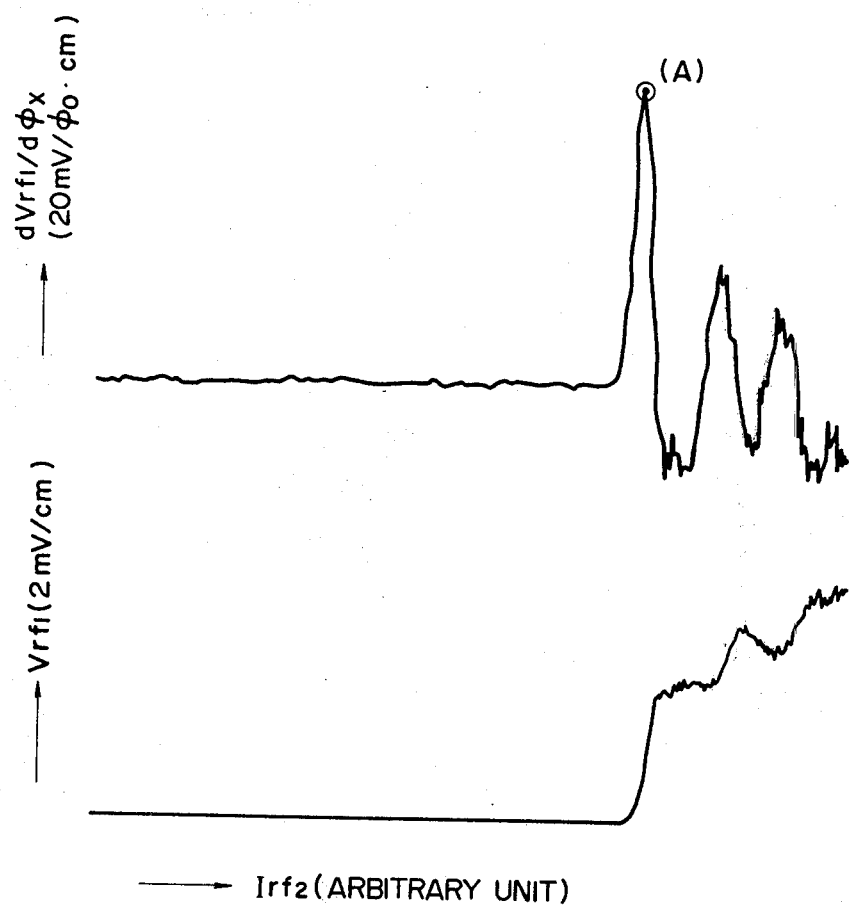

FIGS. 13 and 14 show examples of the test results on the utilization of the electromagnetic nonlinearity of the SQUID according to this invention. In the circuit of FIG. 10-II, 20 MHz is used as $f_1$ and 40 MHz (twice as high as $f_1$) as the frequency of the exciting alternating current applied to the SQUID. A response output with a frequency of 20 MHz is amplified and detected. The detected AC voltage having a frequency of 20 MHz is a low-harmonic component of the 40 MHz exciting alternating current outputted from the SQUID. If the frequency of the exciting alternating current is lowered to 20 MHz, no response output from the SQUID is detected in the output from the phase-locked detector 107.

FIG. 13 shows the output voltage $Vrf_1$ with a frequency of 20 MHz detected in the output from the tuning amplifier 103 and the magnetic flux sensitivity $dVrf_1/d\phi_x$ detected in the output from the phase-locked detector 107 when the 40 MHz exciting alternating current $Irf_2$ is increased.

FIG. 14 shows the output voltage obtained by changing the external magnetic flux $\phi_x$ while fixing the exciting alternating current $Irf_2$ having a frequency $f_2$ at point (A) in FIG. 13. FIG. 14-I shows the output voltage $V_{108}$ that is obtained when the feedback circuit 109 in FIG. 10-II is operated. FIG. 14-II shows the output voltage at the magnetic flux sensitivity $dVrf_1/d\phi_x$ that is obtained when the feedback circuit 109 is not operated. Both FIGS. 14-I and 14-II show that the SQUID fluxmeter obtains an output voltage of 22 mV per flux quantum $\phi_o$.

As will be understood from the above description, this invention offers many advantages, such as marked relieving of difficulties in the manufacture and use of the superconducting quantum interference devices, selection of any desired operating temperature range, and compensation of quality changes with time.

What is claimed is:

1. A superconducting quantum interference fluxmeter, comprising an electric circuit containing a SQUID (superconducting quantum interference device) and a resonant circuit electromagnetically coupled with said SQUID, means for applying to said SQUID through said resonant circuit at least two different radio frequency exciting currents of which the frequencies are integral multiples or integral fractions of one another, means for controlling the phase relationship of said exciting currents, tuned amplifier means coupled with said resonant circuit for amplifying from among frequency components of the output of said SQUID only a frequency which is the frequency of one only of said exciting currents and means for detecting external magnetic flux applied to said SQUID by amplifying and detecting the alternating current amplified by said amplifier means, said exciting currents being selected to produce in said SQUID, by the combined effect of said currents, internal magnetic flux which is below a critical value at which said electric circuit produces an output in the absence of external flux applied to said SQUID.

2. A superconducting quantum interference fluxmeter according to claim 1, in which said means for applying exciting current comprises a first excitation AC source for producing a first radio frequency and a second excitation AC source for producing a second radio frequency which is an integral multiple or integral fraction of said first radio frequency.

3. A superconducting quantum interference fluxmeter according to claim 2, in which said means for controlling the phase relationship of said exciting currents comprises a phase controller coupled with said first and second AC sources.

4. A superconducting quantum interference fluxmeter according to claim 1, in which said means for applying exciting current comprises a waveform generator producing a plurality of exciting current frequencies.

5. A superconducting quantum interference fluxmeter according to claim 1, further comprising means for supplying a detecting AC signal to said detecting means, and means for feeding back the output of said detecting means to said electric circuit.

6. A superconducting quantum interference fluxmeter, comprising an electric circuit containing a SQUID (superconducting quantum interference device) and a resonant circuit electromagnetically coupled with said SQUID, means for applying to said SQUID through said resonant circuit a radio frequency exciting circuit, tuned amplifier means coupled with said resonant circuit for amplifying from among frequency components of the output of said SQUID only a frequency which is an integral multiple (other than 1) or integral fraction of the frequency of said exciting current, and means for detecting external flux applied to said SQUID by amplifying and detecting the alternating current amplified by said amplifier means, said exciting current being selected to produce in said SQUID internal flux which is below a critical value at which said electric circuit produces an output in the absence of external flux applied to said SQUID.

* * * * *